United States Patent

Denzinger et al.

[11] Patent Number: 6,100,016
[45] Date of Patent: Aug. 8, 2000

[54] DEVELOPER FOR IRRADIATED, RADIATION-SENSITIVE RECORDING MATERIALS

[75] Inventors: Steffen Denzinger; Michael Doerr, both of Mainz; Klaus-Peter Konrad, Gensingen; Andreas Elsaesser, Idstein, all of Germany; Paul Eckler, Princeton Jct., N.J.

[73] Assignee: Agfa-Gevaert AG, Leverkusen, Germany

[21] Appl. No.: 09/395,961

[22] Filed: Sep. 14, 1999

[51] Int. Cl.$^7$ ........................................ G03C 5/30
[52] U.S. Cl. .......................... 430/331; 430/444; 430/466; 430/493
[58] Field of Search .................... 430/331, 444, 430/466, 493

[56] References Cited

U.S. PATENT DOCUMENTS

| | | | |
|---|---|---|---|
| 4,716,098 | 12/1987 | Mack et al. | 430/331 |
| 5,008,032 | 4/1991 | Diessel et al. | 510/434 |
| 5,009,805 | 4/1991 | Perner et al. | 510/434 |
| 5,972,572 | 10/1999 | Konrad et al. | 430/331 |

FOREIGN PATENT DOCUMENTS 0 323 836   7/1989   European Pat. Off. .

*Primary Examiner*—Hoa Van Le
*Attorney, Agent, or Firm*—Foley & Lardner

[57] ABSTRACT

The invention relates to a developer for irradiated, radiation-sensitive recording materials, in particular for the production of offset printing plates, which contains water, a compound which is alkaline in aqueous solution and a copolymer which acts as an emulsifier and has units of (I) a hydrophobic vinyl compound which has at least one optionally substituted mono- or bicyclic ($C_6$–$C_{14}$)aryl radical and (II) a hydrophilic, ethylenically unsaturated carboxylic acid. Some of the carboxyl groups of the copolymer are esterified with reaction products of (A) ($C_1$–$C_{30}$)alkanols, ($C_8$–$C_{25}$) alkanoic acids, ($C_1$–$C_{12}$)-alkylphenols or di($C_1$–$C_{20}$) alkylamines with (B) ($C_2$–$C_4$)-alkylene oxides or tetrahydrofuran, the molar ratio (A):(B) being in the range from 1:2 to 1:50. If it is intended to develop recording materials having a negative-working layer, the developer additionally contains a water-miscible organic solvent and a surface-active compound. The developer has a low initial viscosity, which increases only slowly with increasing contamination with layer components. Furthermore it shows only a particularly low tendency to foam.

17 Claims, No Drawings

DEVELOPER FOR IRRADIATED, RADIATION-SENSITIVE RECORDING MATERIALS

The invention relates to a developer for irradiated, radiation-sensitive recording materials which contains water and at least one compound which is alkaline in aqueous solution. Said developer is particularly suitable for developing radiation-sensitive recording materials from which offset printing plates are produced.

An aqueous alkaline developer of the type stated at the outset has to meet a number of requirements: it should have high productivity, i.e. the developing capacity should decrease as little as possible after prolonged use and hence increased contamination by detached components of the layer. The so-called "tone limit" at which the developer is spent and the layer is removed only incompletely from the nonimage parts should be as high as possible. Of course, said developer should develop the recording materials as rapidly and completely as possible. This is particularly important in the mechanical production of the printing plates in processing lines. Owing to the short cycle times, a development time of substantially less than 30 s may be necessary.

For ecological and economic reasons, it is advantageous if the developer can be offered in the form of a liquid concentrate which the consumer himself dilutes with water. The hardness of the water differs from region to region, this should not influence the properties of the ready-to-use developer. This results in the requirement for low sensitivity to water hardness.

During development, neither form nor solid precipitates should form. In addition, foam formation complicates the pumping and transferring during the preparation as well as during the use of the developer. The latter might contaminate the development units and hence give rise to the high level of maintenance or even settle on the developed recording material.

Moreover, the developer solution laden with layer residues must be compatible with the gumming solutions used in the processing line. Owing to the unavoidable entrainment of contaminated developer solution by printing plates passing through, layer residues may accumulate after a relatively short time in the downstream storage container of the rubber solution. In the most unfavorable case, this gives rise to solid precipitates which, after a phase of concentration, are redeposited on the printing surface of the developed printing plate via the roller rail system of the gumming station and can thereby render the plate unusable.

EP-A 0 323 836 describes aqueous alkaline developers for positive- and negative-working recording materials. In addition to an alkaline composition, they contain a thickener which adjusts their viscosity to 5 to 10,000 cps. If necessary, the developers may also contain organic solvents, such as benzyl alcohol or ethylene glycol monophenyl ether. Developers for positive-working recording material may furthermore contain surfactants, in particular anionic or amphoteric surfactants. The thickeners used are fine silicate powders or water-soluble polymers such as starch, gum arabic, sodium alginate, pectin, viscose, methylcellulose, carboxymethylcellulose, polyvinyl alcohol, polyvinyl methyl ether or polyvinylpyrrolidones.

A very specific aqueous alkaline developer for negative-working recording materials for the production of offset printing plates is disclosed in EP-A 0 602 736. It permits particularly short development times and prevents excessive deposits in the processing units. Moreover, it is said rapidly to dissolve deposits already formed. It contains an organic solvent, an anionic surfactant, an alkali metal tetraborate, an alkali metal salt of an aliphatic monocarboxylic acid, an alkali metal salt of an aliphatic dicarboxylic acid, an alkali metal citrate, a poly(alkylene glycol), an alkali metal salt of a hydroxylated aromatic carboxylic or sulfonic acid and an alkaline buffer system which ensures an alkaline pH.

A developer suitable for the production of negative-working printing plates is also the subject of U.S. Pat. No. 3,954,472. It contains ammonium sulfite and polyvinylpyrrolidone dissolved in water and an alcohol, in particular n-propanol. The polyvinylpyrrolidone acts as a gumming composition.

Polyvinylpyrrolidone or a copolymer having units of N-vinylpyrrolidone is also used in the aqueous alkaline developer according to DE-A 42 24 205. The developer furthermore contains an alkaline agent such as NaOH, KOH, $Na_2CO_3$, $K_2CO_3$, sodium silicate, potassium silicate, trisodium phosphate or tripotassium phosphate. If necessary, a surfactant of the alkali metal sulfate or alkali metal sulfonate type, an antifoam and an organic solvent, such as benzyl alcohol or ethylene glycol monomethyl ether, ethylene glycol monoethyl ether, ethylene glycol monobutyl ether or ethylene glycol monophenyl ether, may also be added. It is envisaged in particular for the development of color proof materials, where it prevents the formation of stains in the nonimage parts.

EP-A 0 004 014 discloses a particularly productive developer for recording materials having exposed, negative-working layers of diazonium salt polycondensates and water-insoluble organic polymers. It contains an anionic wetting agent, polyvinyl alcohol, poly(N-vinyl-N-methylacetamide), benzyl alcohol, glyceryl triacetate and a buffer which ensures a pH in the range from 4 to 8. Since only high-boiling organic solvents are used in this developer, its composition remains virtually constant even on prolonged standing in open containers.

With the aqueous alkaline developer according to EP-A 0 180 122, it is possible to achieve particularly rapid and good development of exposed, negative-working photoresist layers. It also has a long life, can be used in automatic developing machines and prevents the formation of cakes and small cakes of detached layer components. In addition to water and an alkaline agent, it contains a complexing agent, an anionic surfactant, an alkanoic acid or a salt thereof, a buffer substance and an emulsifier, which is preferably poly(N-vinyl-N-methylacetamide), polyvinyl alcohol, dextrin, gum arabic or a cellulose ether.

Although the stated polymeric emulsifiers result in a substantial improvement in the developer properties, they also have disadvantages. Thus, they substantially determine the viscosity, i.e. they result in a relatively high viscosity even when they are contained in the developer only in small amounts. However, as low an initial viscosity as possible and a moderate increase in viscosity with increasing contamination of the developer by detached layer components are necessary for minimizing the mechanical load on components of the processing line (pumps, hose connection) on the one hand and, on the other hand, for counteracting premature sludge formation in the developing section of the processing machine and hence greater cleaning work on changing the developer.

With the known emulsifiers, it is always only a compromise that it achieved. Owing to the strongly viscosity-increasing effect of the known emulsifiers, their amount in the developer solution is limited.

With the developers known to date, it was not possible simultaneously to meet all the stated requirements—no formation of cakes or small cakes by detached layer components in the developer station or in the downstream gumming station of the printing plate processing machine, at the same time low initial viscosity and small viscosity increase with growing contamination. It was therefore the object to provide a corresponding improved developer for radiation-sensitive recording materials.

A promising approach to solving the problem has already been described in EP-A 923 001. This discloses an aqueous alkaline developer which contains, as an emulsifier, a copolymer having units of at least one hydrophobic vinyl compound which has alkyl radicals having up to 30 carbon atoms and at least one hydrophilic, ethylenically unsaturated carboxylic acid, some of the carboxyl groups in these units being esterified with reaction products of (A) ($C_1$–$C_{30}$) alkanols, ($C_8$–$C_{25}$)alkanoic acids, ($C_1$–$C_{12}$)alkylphenols or di($C_1$–$C_{20}$)alkylamines with (B) ($C_2$–$C_4$)alkylene oxides or tetrahydrofuran, the molar ratio (A):(B) being in the range from 1:2 to 1:50. This developer is sufficient substantially to achieve the object, except that it foams to an excessive extent. Foam formation complicates the handling of developers, in particular the emptying, transferring and pumping. It can finally lead to overflowing of the developing baths in the developing machines. It was therefore necessary to improve the known developer so that it foams to a substantially smaller extent.

Surprisingly, this object was achieved by copolymers which have an emulsifying effect and are structurally similar to those disclosed in EP-A 932 001 but in which the units described there and comprising hydrophobic vinyl compounds having aliphatic hydrocarbon radicals are replaced by units of hydrophobic vinyl compounds having aromatic hydrocarbon radicals.

The present invention thus relates to a developer for irradiated, radiation-sensitive recording materials which contains water and at least one compound which is alkaline in aqueous solution, which developer contains at least one copolymer acting as an emulsifier and comprising units of (I) at least one hydrophobic vinyl compound which has at least one optionally substituted, mono- or bicyclic ($C_6$–$C_{14}$)aryl radical and (II) at least one hydrophilic, ethylenically unsaturated carboxylic acid, some of the carboxyl groups in these units being esterified with reaction products of (A) ($C_1$–$C_{30}$)alkanols, ($C_8$–$C_{25}$)alkanoic acids, ($C_1$–$C_{12}$)alkylphenols or di($C_1$–$C_{20}$)alkylamines with (B) ($C_2$–$C_4$)alkylene oxides or tetrahydrofuran, the molar ratio (A):(B) being in the range from 1:2 to 1:50.

In a preferred embodiment the molar ratio (A):(B) is in the range from 1:4 to 1:10.

The hydrophobic vinyl compound (I) which has at least one optionally substituted, mono- or bicyclic ($C_6$–$C_{14}$)aryl radical is preferably a compound having an optionally substituted phenyl group or a naphthyl group. The bicyclic aryl radical is not necessarily a fused radical; it may also be an unfused radical, for example a biphenyl-4-yl radical. The aromatic radical may in turn be part of an aralkyl group in which the alkyl moiety generally has a chain length of from 1 to 6 carbon atoms and may be branched or straight-chain. Vinylaromatics can be particularly advantageously used, in particular styrene and α-methylstyrene. Among the substituted sytrenes and α-methylstyrenes, those having an alkyl, alkoxy, hydroxyl and/or aryloxy substituent on the aromatic ring are preferred. Also suitable as the hydrophobic vinyl compound are allylbenzene, phenyl (meth)acrylate, benzyl (meth)acrylate, phenethyl (meth)acrylate, naphthyl (meth) acrylate, 2-phenoxyethyl (meth)acrylate, 2-naphth-1- or -2-yloxyethyl (meth)acrylate, 3-phenoxypropyl (meth) acrylate, 3-naphth-1- or -2-yloxypropyl (meth)acrylate, N-phenyl-(meth)acrylamide, N-benzyl(meth)acrylamide, N-phenethyl (meth) acrylamide, N-naphthyl (meth) acrylamide, N-vinylbenzamide, phenyl vinyl ether and benzyl vinyl ether. Here as well as below, the ". . . (meth) acrylate" means ". . . acrylate and/or methacrylate". The same applies to ". . . (meth)acrylamide", etc. These compounds, too, are optionally substituted, in particular by halogen atoms (in particular Cl or Br) or by ($C_1$–$C_6$)alkyl or ($C_1$–$C_6$)alkoxy groups. The type of substituent is not subject to any special restrictions but they should be chosen so that they do not increase the foam formation in the ready-prepared copolymer, i.e. they should not result, for example, in any pronounced surfactant properties, as was the case, for example, with long-chain alkyl radicals having 8 or more carbon atoms. As a rule, the hydrophobic vinyl compound (I) contains not more than 30 carbon atoms.

However, styrene, α-methylstyrene and substituted styrenes (especially hydroxystyrenes) and benzyl(meth) acrylate are preferred. Mixtures of a plurality of different hydrophobic vinyl compounds containing aryl groups can also be used.

The ethylenically unsaturated carboxylic acid (II) is preferably an α,β-unsaturated carboxylic acid having 3 to 8 carbon atoms. It may be a mono-, di- or tricarboxylic acid, ($C_3$–$C_8$)monocarboxylic acids, such as acrylic acid, methacrylic acid or crotonic acid, and ($C_4$–$C_8$)dicarboxylic acids, such maleic acid, itaconic acid, methylmalonic acid, mesaconic acid or citraconic acid, being preferred. In the preparation of the copolymers, it is of course also possible to use acid derivatives, in particular acid anhydrides.

Suitable ($C_1$–$C_{30}$)alkanols (A) are methanol, ethanol, propanol, isopropanol, butanol, isobutanol, sec-butanol, tert-butanol, pentanol, hexanol, 2-ethylhexanol, heptanol, octanol, decanol, dodecanol, tridecanol, tetradecanol, pentadecanol, octadecanol, eicosanol and hexacosanol. ($C_{10}$–$C_{15}$)alkanols as obtainable by the oxo process (and therefore also referred to as "oxo alcohols") are preferred.

Preferred ($C_8$–$C_{25}$)alkanoic acids are octanoic (=caprylic acid), nonanoic acid (=pelargonic acid), decanoic acid (=capric acid), undecanoic acid, dodecanoic acid (=lauric acid), tridecanoic acid, tetradecanoic acid (=myristic acid), pentadecanoic acid, hexadecanoic acid (=palmitic acid), octadecanoic acid (=stearic acid), eicosanoic acid (=arachidic acid), docosanoic acid (=behenic acid) and tetracosanoic acid (=lignoceric acid).

The ($C_1$–$C_{12}$)alkylphenols (A) are preferably methylphenol, butylphenol, isobutylphenol, pentylphenol, hexylphenol, octylphenol, nonylphenol, decylphenol and dodecylphenol, the straight-chain or branched alkyl groups preferably being present in the ortho- or para-position relative to the phenolic hydroxyl group.

Suitable di($C_1$–$C_{20}$)alkylamines (A) are dimethylamine, ethylmethylamine, diethylamine, dipropylamine, ethylpropylamine, dibutylamine, dipentylamine, dioctylamine, ethyloctylamine, didecylamine, didodecylamine and dioctadecylamine. Among the secondary amines, those having 8 to 18 carbon atoms in each alkyl group are preferred.

Preferably used ($C_2$–$C_4$)alkylene oxides (B) are ethylene oxide and propylene oxide; however butylene oxide and isobutylene oxide or a mixture thereof may also be used. It is also possible to carry out the reaction with two or more of the stated alkylene oxides in succession, for example to react the compounds of (A) first with ethylene oxide and then with propylene oxide (or vice versa).

Preferred copolymers are those in which from 5 to 50%, particularly preferably from 10 to 35%, of the carboxyl groups of the ethylenically unsaturated carboxylic acid (II) are esterified. The units (I) and (II) should together account for at least 50 mol %, preferably at least 70 mol %, of all units in the copolymer. The amount of the units (II) should be at least 5 mol %, preferably at least 10 mol %.

In a preferred embodiment, the copolymer acting as emulsifier is obtainable by copolymerization of (I) at least one compound having an optionally substituted phenyl group or a naphthyl group and (IIa) at least one ethylenically unsaturated dicarboxylic anhydride having 4 to 8 carbon atoms, the molar ratio (I): (IIa) being in the range from 7:3 to 3:7, or (IIb) at least one ethylenically unsaturated monocarboxylic acid having 3 to 8 carbon atoms, the molar ratio (I):(IIb) being in the range from 1:1 to 1:5, subsequent partial esterification of the carboxyl groups of the copolymer with reaction products of (A) ($C_1$–$C_{30}$)-alkanols, ($C_8$–$C_{22}$) fatty acids, ($C_1$–$C_{12}$) alkylphenols or secondary ($C_2$–$C_{30}$) amines with (B) at least one ($C_2$–$C_4$)-alkylene oxide or tetrahydrofuran, the molar ratio (A):(B) being in the range from 1:2 to 1:50, and hydrolysis of the anhydride groups of the copolymer to carboxyl groups or salts thereof (preferably alkaline earth metal or alkali metal salts, in particular K or Na salts), the partial esterification being continued until between 5 and 50% of the carboxyl groups of the copolymer have been esterified.

The copolymers used in the developer according to the invention are also obtainable by copolymerization of (I) with the reaction products (IIa) or (IIb) with (A) and (B) in the abovementioned molar ratio. The copolymers can moreover contain up to 50 mol % of other units, in particular those of amides of monoethylenically unsaturated ($C_3$–$C_8$) carboxylic acids, whose amido groups correspond to the formula

—CO—$NR^1R^2$ in which

| | |
|---|---|
| $R^1$ | is a ($C_8$–$C_{28}$) alkyl group or a group of the formula RO—[$CHR^3$—$CHR^4$—O]$_{n-1}$—$CHR^3$—$CHR^4$— and |
| $R^2$ | is a hydrogen atom or one of the groups $R^1$, |
| $R^3$ and $R^4$ | are identical or different and are a hydrogen atom, a methyl group or an ethyl group, |
| R | is a ($C_1$–$C_{28}$) alkyl group and |
| n | is an integer from 2 to 100. |

The copolymers used in the developer according to the invention generally have K values of from 6 to 200, preferably from 10 to 80 (determined according to H. Fikentscher in 1% strength aqueous solution at 25° C. and pH 7.5, in the form of the sodium salt), corresponding to an average molecular weight $M_w$ of from 500 to 500,000, preferably from 1000 to 150,000. The monomer units are as a rule randomly distributed therein; the copolymers are thus not block copolymers.

Preferred components (IIa) are monoethylenically unsaturated dicarboxylic anhydrides having 4 to 8 carbon atoms, such as maleic anhydride, itaconic anhydride, mesaconic anhydride, citraconic anhydride or methylenemalonic anhydride, in particular maleic and itaconic anhydride. Suitable conditions for the preparation of the copolymers are described in detail in EP-A 0 367 049. Among the ethylenically unsaturated ($C_3$–$C_8$)carboxylic acids (IIb), acrylic acid and methacrylic acid are preferred since they are available on a large industrial scale.

The copolymers do not acquire their specific emulsifying properties until partial esterification of their carboxyl groups with the stated reaction products of the compounds (A) and (B). These are preferably etherification products of ($C_1$–$C_{30}$) alcohols or secondary ($C_2$–$C_{30}$)amines (A), which have undergone an addition reaction with polyalkylene oxide chains comprising from 3 to 30 ($C_2$–$C_4$)alkylene oxide units (B), preferably ethylene oxide or propylene oxide or mixtures of the two. Compounds of this type which carry an OH group on the polyalkylene oxide chain end are conventional commercial products in the form of nonionic surfactants (for example ethoxylates/propoxylates of fatty alcohols, fatty acids, fatty amides and fatty amines).

In order to obtain readily water-soluble substances, the carboxyl groups remaining in the partially esterified copolymer after the hydrolysis are neutralized by reaction with alkali, ammonia and/or alkanolamines so that finally aqueous solutions having a pH of from 4 to 10, preferably from 6 to 8, are obtained. Aqueous NaOH or KOH solutions are preferably used for the neutralization.

The developer according to the invention shows at least as high a load capacity as that disclosed in EP-A 923 001 (i.e. it can absorb at least as many layer components from the developed recording materials without solid components being precipitated (in particular in the form of cakes) or such a solid component settling on the already developed materials (which leads to the formation of so-called "redeposits")) in combination with a substantially reduced tendency to foam.

General synthesis method for copolymers having units of ethylenically unsaturated dicarboxylic anhydrides (IIa):

In a polymerization reactor provided with a stirrer, a thermometer, a condenser, nitrogen inlet and outlet and metering apparatuses, an aromatic vinyl compound (I) or a mixture of aromatic vinyl compounds (I) and an ethylenically unsaturated dicarboxylic anhydride (IIa) (cf. Table 1) and polyvinyl ethyl ether having a K value of 50 were initially introduced and were heated to 100° C. in a gentle stream of nitrogen. As soon as the temperature was reached, 1 mol % of tert-butyl peroxy-2-ethylhexanoate (30% by weight in the olefin or the olefin mixture) was added in the course of from 1 to 3 hours. The reaction mixture is heated at 100° C. for a further 2 to 4 hours. A clear solution of the copolymer in the olefin was obtained. Unconverted aromatic vinyl compound (I) was then distilled off under reduced pressure.

TABLE I

| Polymer | Monomer I | Molar fraction* | Monomer IIa | Molar fraction | Mw** |
|---|---|---|---|---|---|
| A | Styrene | 5 | Maleic anhydride | 5 | 3000 |
| B | Benzyl methacrylate | 6 | Maleic anhydride | 5 | 7000 |

*Molar fraction of monomer units in the starting monomer mixture
**Average molecular weight $M_w$, determined by gel permeation chromatography (GPC) in N,N-dimethyl-acetamide as eluent against a polymethyl methacrylate standard.

Synthesis example for the partial esterification of the copolymers of the components (I) and (IIa) (polymers 1–5):

The copolymers described above were reacted with an adduct from the reaction of ethylene oxide with an oxo alcohol in the presence of para-toluenesulfonic acid in the course of from 2 to 12 hours under reflux. The reaction mixture was then cooled to 100° C. Thereafter water and, if required, aqueous alkali or alkaline earth solution were added and stirring was carried out for a further 2 hours at from 50° C. to 70° C. Light brown, viscose solutions resulted.

TABLE II

| 1 | 2 | 3 | 4 | 5 | 6 | 7 | 8 |
|---|---|---|---|---|---|---|---|
| 1 | A | 25 | 1 mol of $C_{13}/C_{15}$-oxo alcohol + 7 mol of ethylene oxide (EO) | NaOH | 36.2 | 7.2 | 5000 |
| 2 | A | 10 | 1 mol of $C_8$-oxo alcohol + 5 mol of EO | KOH | 38.0 | 7.0 | 4500 |
| 3 | A | 32.5 | 1 mol of $C_{13}/C_{15}$-oxo alcohol + 10 mol of EO | Mg(OH)$_2$ | 48.7 | 7.2 | 6000 |
| 4 | B | 15.0 | 1 mol of $C_{10}$-oxo alcohol + 8 mol of EO | NaOH | 40.0 | 7.4 | 11,000 |
| 5 | B | 12.5 | 1 mol of ethanol + 12 mol of EO | KOH | 35.0 | 7.3 | 9000 |

The numbers in the first row of the table are:
1 Polymer No.
2 Starting copolymer (see Table 1)
3 Amount of the converted COOH groups [%]
4 Compound obtainable by alkoxylation of
5 base used
6 Solids content of the aqueous solution [%]
7 pH
8 Average molecular weight $M_w$ of the product Synthesis example for copolymers having monomer units of (IIb) (polymer 6):

α-Methylstyrene, acrylic acid and the reaction product of 8 mol of ethylene oxide with 1 mol of $C_{13}/C_{15}$-oxo alcohol and acryloyl chloride in the molar ratio of 5:3:2 were heated to 100° C. in the polymerization reactor described above. 1 mol % of tert-butyl peroxy-2-ethylhexanoate (30% by weight in α-methylstyrene) was metered in in the course of 3 hours and stirring was carried out for a further 3 hours at 100° C. The excess α-methylstyrene was then distilled off under reduced pressure and aqueous potassium hydroxide solution was added to the distillation residue so that a viscose solution having a solids content of 38.4% and a pH of 7.0 resulted. The average molecular weight $M_w$ (determined by GPC using N,N-dimethyl acetamide as eluent against polymethyl methacrylate as standard) was 15,500.

In the ready-to-use form, the aqueous alkaline developer according to the invention contains one of the copolymers described, which acts as an emulsifier, in an amount of from 0.1 to 10.0% by weight, in particular from 0.2 to 8.0% by weight and preferably from 0.5 to 6.0% by weight, based in each case on the total weight of the ready-to-use developer.

The developer according to the present invention is particularly suitable for developing recording materials having a negative-working radiation-sensitive layer. It then additionally contains at least one water-miscible organic solvent and at least one surface-active compound (surfactant).

The alkaline compound is preferably an alkanolamine, a hydroxide, a phosphate or a carbonate. Preferred alkanolamines are ethanolamine, di- and triethanolamine, isopropanolamine, diisopropanolamine and tris (hydroxymethyl)-aminomethane. Preferred hydroxides are alkali metal and alkaline earth metal hydroxides and di-, tri- and tetra-($C_1$–$C_{10}$) alkylammonium hydroxides. Preferred carbonates are sodium, potassium and ammonium carbonates or bicarbonates. Of all alkaline compounds, the alkanolamines and alkali metal hydroxides are most suitable.

The amount of the alkaline compound(s) should be tailored to the type of recording material. As a rule, it is 0.1 to 20% by weight, in particular from 0.5 to 10% by weight and preferably from 1.0 to 5.0% by weight, in each case based on the total weight of the ready-to-use developer. In the case of liquid concentrates, the amount is correspondingly higher. In general, the pH of the ready-to-use developer according to the invention is from 8.0 to 13.0, preferably from 8.5 to 11.5.

In the context of the present invention, an organic solvent which, in the amount used (up to 20% by weight), forms a uniform solution with water at a temperature at which the developer is usually stored or used (about 0 to 60° C.) is defined as "miscible with water". Particularly short development times are achieved by adding one or more of the following organic solvents: alcohols, especially benzyl alcohol, ethylene glycol monophenyl ether, 1-phenylethanol, 2-phenylethanol, propylene glycol monomethyl and -phenyl ether and glycerol and glyceryl acetates. The amount of organic solvent in the ready-to-use developer is expediently from 0.5 to 15.0% by weight, in particular from 1.0 to 10.0% by weight and preferably from 2.0 to 6.0% by weight, based in each case on the total weight of the developer. Since only relatively small amounts of organic solvent are present in the developer, its composition is virtually unchanged during use. It thus has a relatively long life in the development apparatuses.

Suitable surfactants in the developer according to the invention are many inorganic surface-active compositions. In addition, mixtures of anionic with nonionic and/or zwitterionic surface-active substances can be successfully used. Anionic surfactants, such as alkali metal, preferably sodium, octylsulfates, dodecylbenzenesulfonates, alkylphenolethersulfates, naphthalenesulfonates, sulfosuccinates and alkyletherphosphates, have proven particularly useful. Suitable nonionic surfactants originate from the substance classes comprising the ($C_{10}$–$C_{18}$)fatty alcohol ethoxylates, polyethylene glycols, ethylene oxide/propylene oxide (block) copolymers and alkylphenol ethoxylates and the zwitterionic surfactants of the betaine or sulfobetaine type and may account for from 0 to 80% by weight of the total amount of surfactant. The amount of the surface-active substance(s) in the developer is in general from 0.2 to 12.0% by weight, preferably from 0.5 to 8.0% by weight, particularly preferably from 1.0 to 6.0% by weight, based in each case on the total weight of the developer.

Depending on the type of recording materials to be processed, the developer according to the invention may contain further additives, in particular buffer substances, complexing agents (especially those which bind calcium), antifoams or sequestering agents.

n-Alkanoic acids having 6 to 12 carbon atoms and/or salts thereof, in particular caprylic, pelargonic, capric and lauric acid, have proven useful as buffer substances in the developer according to the invention. In the ready-to-use developer, these acids may be present in an amount of from 0.5 to 8.0% by weight, in particular from 1.0 to 6.5% by weight, based on the total weight of the developer.

Suitable buffering substances are in principle all those which preferably are effective in the pH range of from 8 to 13. In addition to the stated n-alkanoic acids and the salts thereof, in particular the generally available buffer substances from the group consisting of the carbonates, phosphates, borates, alkali metal salts of glycine and amine are used. Very common buffer systems are, for example, mixtures of carbonate/bicarbonate or phosphate/hydrogen phosphate.

The salts of low molecular weight phosphates, so-called oligophosphates, having 2 to 10, preferably 2 to 6, in particular 2 to 4, phosphorus units may be used as complexing agents. Particularly preferred are the alkali metal salts, in particular the sodium and potassium salts, including, for example, tetrasodium diphosphate, pentasodium triphosphate, pentapotassium triphosphate and hexasodium tetraphosphate.

Alkali metals salts, preferably sodium salts, of nitrilotriacetic acid and of ethylenediaminetetraacetic acid, and trishydroxymethylaminomethane, also give good results. The content of complexing agents in the ready-to-use developer is expediently from 0.1 to 5.0% by weight, in particular from 0.5 to 4.0% by weight and preferably from 1.0 to 3.0% by weight.

The water content in the developer preferably comprises demineralized water and the amount of water in the ready-to-use form is from 70 to 95%, preferably from 75 to 90% by weight.

Moreover, the developer according to the invention may also be formulated as a concentrate. The amount of nonaqueous components therein is increased up to three times of the stated amounts. Such concentrates, too, have no annoying odor, and no precipitates form even after storage at temperatures around the freezing point.

In the apparatuses for the development of recording materials, developer station, washing station and gumming station are usually connected in series. Increasing contamination of the developer with layer components results in development which is slower and no longer complete. During washing, it is scarcely possible to avoid the selective removal of effective developer components, so that their components are absorbed from the entrained developer solution onto the surface of the recording material in agglomerated form and may be evident there as undesired impurities. These absorbed layer components are not dissolved and washed away by the gumming solution but only raised from the substrate surface as skin ("cake formation"). This phenomenon is effectively delayed by the developer according to the invention without the simultaneous likelihood of a considerable increase in the developer viscosity with increasing contamination with the layer components, which in turn helps to keep the amount of entrained developer small.

The developer according to the invention is in principle suitable for processing a number of positive- and negative-working recording materials. Depending on the type of radiation-sensitive layer, the negative-working materials may be divided into those 1. having a negative-working layer based on diazonium salt polycondensation compounds,
2. having a negative-working layer which contains olefinically unsaturated compounds capable of the radical polymerization and photopolymerization initiators, and
3. which are based on a combination of the principles stated under 1. and 2.

A negative-working layer based on diazonium salt polycondensation compounds contains, for example, condensates of diphenylamine-4-diazonium salts with aldehydes, preferably formaldehyde. Cocondensates which, in addition to the diazonium salt units, also contain other, nonphotosensitive units which are derived from condensable compounds, in particular aromatic amines, phenols, phenol ethers, aromatic thioethers, aromatic hydrocarbons, aromatic heterocycles and organic acid amides, are particularly advantageously used. Suitable diazonium salt condensates of this type are described in DE-A 20 24 244 and 27 39 774.

For stabilizing the photosensitive mixture, it is advantageous to add a compound having acid character to said mixture. Mineral acids and strong organic acids are suitable, among which phosphoric acid, sulfuric acid, perchloric acid, boric acid and para-toluenesulfonic acid are preferred. A particularly suitable acid is orthophosphoric acid.

A further main component of the negative-working layers of type 1 is at least one nonphotosensitive polymeric binder which has pendant carboxyl groups and is soluble or at least swellable in aqueous alkaline solutions. This binder may be, for example, the reaction product of an intramolecular anhydride of an organic polycarboxylic acid with a synthetic polymer containing hydroxyl groups, which contains no further functional groups capable of reacting with acid anhydrides. Functionalized binders of this type are described in detail in DE-A 34 04 366.

Plasticizers, adhesion promoters, dyes, pigments and photochemical color formers may furthermore be added to the photosensitive mixtures.

The negative-working layer of type 2 preferably contains a combination of an ethylenically unsaturated monomer capable of radical polymerization, in particular an acrylic or methacrylic ester of a polyhydric alcohol, and a photoinitiator. Polycondensates or polymers having pendant carboxyl groups are preferably used as alkali-soluble binders in these layers.

Preferably, negative-working layers are protected by an overcoat, in particular against the admission of atmospheric oxygen. For this purpose, the overcoat usually contains polymers which give rise to reduced oxygen permeability. Particularly suitable for this purpose are polyvinyl alcohol, polyvinylpyrrolidone or gelatine.

The developer according to the invention is also suitable for recording materials having a positive-working radiation-sensitive layer. However, the amount of the organic solvent must then be relatively small so that the image parts are not excessively attacked.

Metals are generally used as substrate material for layers having a thickness of less than about 10 $\mu$m. Usually, bright-rolled, mechanically roughened and/or electrochemically roughened and, if required, anodized aluminum, which may also have been chemically pretreated (for example with polyvinylphosphonic acid, silicates, phosphates or hexafluorozirconates), is used for offset printing plates.

The substrate material is coated in a known manner by spin-coating, spraying, dipping or roller-coating, by means of slot dies or doctor blades or by casting.

After the application of the layer, the recording material is irradiated imagewise and, if required, uniformly, depending on the type of layer. Conventional radiation sources are, for example, tubular lamps, pulsed xenon lamps, metal halide-doped high pressure mercury vapor lamps and carbon arc lamps, depending on the application. In automatic processing units, lasers, such as argon or krypton ion lasers, are preferred. Electron radiation or X-rays may also be used for image production.

The subsequent development with the abovementioned developer is generally carried out in spray, back-up or dip-bath development apparatuses at temperatures of from 15 to 50° C., preferably from 18 to 40° C. The duration of development is in general from 5 s to 1 min, preferably from 10 to 40 s.

The development may be followed by further processing steps. For example, printing plates can be treated with an (acidic) hydrophilizing solution or provided with a preservation layer. To increase the stability during printing and the resistance to washout compositions, correction compositions and UV-curable printing inks, the developed plates may be briefly heated. Before the heating, so-called baking gums may also be applied.

The following embodiments are intended to illustrate the invention. pbw denotes part(s) by weight. Percentages are percentages by weight, unless stated otherwise.

A) Negative-working recording material (diazo):
A coating solution comprising
1.50 pbw of a polymer prepared by heating a solution of a polyvinylbutyral (contains 71% by weight of vinylbutyral, 3% by weight of vinyl acetate and 26% by weight of vinyl alcohol units; molecular weight $M_w$ from 70,000 to 80,000) with maleic anhydride and triethylamine in methyl ethyl ketone under reflux,
1.00 pbw of a diazonium polycondensate of 1 mol of 3-methoxydiphenylamine-4-diazonium sulfate and 1 mol of 4,4'-bismethoxymethyldiphenyl ether, precipitated as mesitylene sulfonate,
0.09 pbw of Victoria Sky Blue FGA (Basic Blue 81),
0.07 pbw of benzenephosphonic acid,
0.10 pbw of a silica gel filler having a mean particle size of 3 μm and
97.24 pbw of a mixture of tetrahydrofuran and ethylene glycol monomethyl ether (mixing ratio of THF:EGME= 40:60)

was supplied to an aluminum foil roughened in hydrochloric acid, anodized in sulfuric acid and after-treated with an aqueous polyvinylphosphonic acid solution, so that the layer weight was 1.0 g/m² after drying for 2 min at 100° C.

Negative-working recording materials produced using the coating solution were exposed for 30 s at a distance of 110 cm in a contact printing frame through a photographic negative under a 5 kW metal halide lamp and then developed in a spay development apparatus at 24° C. and at a processing speed of 1.4 m/min (=20 s development time). The gumming station was filled with a commercial gum (AGFA ®Ozasol RC 795).

B) Developer:
In Table IIIa, various developers are compared. The developers A, B and G serve comparative purposes since they contain polymeric emulsifiers differing from those of the developers according to the invention.

Table IIIb contains the test results for comparison. The plates developed with the developer according to the invention were in all cases free of stains, the solid color areas were reproduced without missing parts or other damage due to removal of the layer, and the 60-line screen had a coverage of from 2 to 98%. Development was carried out in each case to a final loading of 20 m²/l.

In addition, the following measured quantities were evaluated:
the rate at which the foam disintegrated again after its formation (determined on the basis of the foam numbers after 10 s and after 60 s)
the number of square meters of plate area which can be developed per liter of developer without problems before redeposition occurs TABLE IIIa Developer compositions (numbers in % by weight)

| Constituent | A | B | C | D | E | F | G | H | I |
|---|---|---|---|---|---|---|---|---|---|
| NaOH solid | — | 1.2 | 1.0 | 1.0 | 1.0 | — | — | — | — |
| KOH solid | 1.5 | — | — | — | — | — | — | — | — |
| Diethanolamine | — | — | — | — | — | 1.5 | — | 1.5 | 1.0 |

TABLE IIIa-continued

Developer compositions (numbers in % by weight)

| Constituent | A | B | C | D | E | F | G | H | I |
|---|---|---|---|---|---|---|---|---|---|
| 1-Aminopropan-2-ol | — | — | — | — | — | — | 1.5 | — | 0.5 |
| Trishydroxymethyl-aminomethane | 1.0 | 1.0 | 1.0 | — | 1.0 | 1.0 | — | 1.0 | 1.0 |
| Octyl sulfate | 2.0 | 2.0 | 2.0 | 2.0 | 2.0 | 3.0 | 3.0 | 3.0 | 3.0 |
| 2-Phenoxyethanol | 3.0 | 3.0 | 3.0 | 3.0 | 3.0 | 4.0 | 4.0 | 4.0 | 4.0 |
| Pelargonic acid | 4.0 | 4.0 | 4.0 | 4.0 | 4.0 | — | — | 4.0 | — |
| NaH₂PO₄ | 0.5 | 0.5 | 0.5 | 0.5 | 0.5 | — | — | 0.5 | 0.5 |
| Pentasodium triphosphate | 2.0 | 2.0 | 2.0 | 2.0 | 2.0 | — | — | — | — |
| Polymer I[1] | 0.5 | — | — | — | — | — | 0.5 | — | — |
| Polymer II[2] | — | 1.0 | — | — | — | — | — | — | — |
| Polymer (Synthesis Example No. 1 to 6) | — | — | 2.0 (1) | 2.0 (2) | 2.0 (3) | 2.0 (4) | — | 3.0 (5) | 2.5 (6) |
| Water demineralized | to 100% | | | | | | | | |

[1] copolymer of Preparation Example 4 from EP-A 0 923 001
[2] copolymer of N-vinyl-N-methylacetamide and dioctyl maleate; $M_w$ about 20,000 (see EP-B 0 027 932)

TABLE IIIb

| Developer formulation | Foam number [%] | | Plate area developable without redeposition (m²/l) |
|---|---|---|---|
| | After 10 sec. | After 60 sec. | |
| A* | 36 | 64 | 16.5 |
| B* | 35 | 67 | 12.5 |
| C | 80 | 92 | 17.0 |
| D | 84 | 95 | 16.5 |
| E | 70 | 84 | 15.5 |
| F | 80 | 92 | 16.0 |
| G* | 34 | 62 | 16.5 |
| H | 82 | 94 | 15.5 |
| I | 76 | 88 | 16.0 |

*Comparative examples

The foam number is determined by filling exactly 50 ml of the developer into a closeable 100 ml measuring cylinder, closing the measuring cylinder and then vigorously shaking it five times by swirling. Immediately thereafter (i.e. t=0 sec) the total volume of the measuring cylinder is filled by liquid and foam; this corresponds to a foam number of 0%. After 10 sec and after 60 sec, the total volume of liquid and foam is determined. If the starting volume of 50 ml is reached again, all the foam has disintegrated and the foam number is then 100%.

Table IIIb clearly shows that the developer according to the invention has a substantially smaller tendency to foam formation and is therefore substantially easier to handle in practice.

What is claimed is:
1. A developer for irradiated, radiation-sensitive recording materials which contains water and at least one compound which is alkaline in aqueous solution, which developer contains at least one copolymer acting as an emulsifier and comprising units of
(I) at least one hydrophobic vinyl compound which has at least one optionally substituted mono- or bicyclic ($C_6$–$C_{14}$)aryl radical and
(II) at least one hydrophilic, ethylenically unsaturated carboxylic acid, some of the carboxyl groups in these units being esterified with reaction products of
(A) ($C_1$–$C_{30}$) alkanols, ($C_8$–$C_{25}$) alkanoic acids, ($C_1$–$C_{12}$) alkylphenols or di ($C_1$–$C_{20}$) alkylamines with

(B) $(C_2–C_4)$alkylene oxides or tetrahydrofuran, the molar ratio (A):(B) being in the range from 1:2 to 1:50.

2. The developer as claimed in claim 1, wherein from 5 to 50%, particularly preferably from 10 to 35%, of the carboxyl groups of the ethylenically unsaturated carboxylic acids (II) have been esterified.

3. The developer as claimed in claim 1, wherein the units (I) and (II) together account for at least 50 mol %, preferably at least 70 mol %, of all monomer units in the copolymer, the units (II) accounting for an amount of at least 5 mol %, preferably at least 10 mol %.

4. The developer as claimed in of claim 1, wherein the copolymer acting as emulsifier is obtainable by copolymerization of (I) at least one compound having an optionally substituted phenyl group or a naphthyl group and (IIa) at least one ethylenically unsaturated dicarboxylic anhydride having 4 to 8 carbon atoms, the molar ratio (I):(IIa) being in the range from 7:3 to 3:7, or (IIb) at least one ethylenically unsaturated monocarboxylic acid having 3 to 8 carbon atoms, the molar ratio (I):(IIb) being in the range from 1:1 to 1:5, subsequent partial esterification of the copolymer with reaction products of (A) $(C_1–C_{30})$alkanols, $(C_8–C_{22})$ fatty acids, $(C_1–C_{12})$-alkylphenols or secondary $(C_2–C_{30})$amines with (B) at least one $(C_2–C_4)$alkylene oxide or tetrahydrofuran, the molar ratio (A):(B) being in the range from 1:2 to 1:50, and hydrolysis of the anhydride groups of the copolymer to carboxyl groups or salts thereof, the partial esterification of the copolymers being continued until between 5 and 50% of the carboxyl groups of the copolymer have been esterified.

5. The developer as claimed in claim 1, wherein the molar ratio (A):(B) is in the range from 1:4 to 1:10.

6. The developer as claimed in claim 1, wherein the copolymer acting as emulsifier additionally contains up to 50 mol % of units of amides of monoethylenically unsaturated $(C_3–C_8)$-carboxylic acids, whose amido groups correspond to the formula

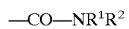

in which $R^1$ is a $(C_8–C_{28})$alkyl group or a group of the formula RO—[CHR³—CHR⁴—O]$_{n-1}$—CHR³—CHR⁴- and $R^2$ is a hydrogen atom or one of the groups $R^1$, $R^3$ and $R^4$ are identical or different and are a hydrogen atom, a methyl group or an ethyl group, R is a $(C_1–C_{28})$alkyl group and n is an integer from 2 to 100.

7. The developer as claimed in claim 1, wherein the copolymers have an average molecular weight $M_w$ of from 500 to 500,000, preferably from 1000 to 150,000.

8. The developer as claimed in claim 1, wherein the amount of the copolymers is from 0.1 to 10.0% by weight, preferably from 0.2 to 8.0% by weight, particularly preferably from 0.5 to 6.0% by weight, based in each case on the total weight of the developer.

9. The developer as claimed in claim 1, which additionally contains a water-miscible organic solvent and at least one surface-active compound, optionally also buffer substances, complexing agents and/or antifoams.

10. The developer as claimed in claim 1, wherein the amount of the alkaline agents is from 0.1 to 20% by weight, preferably from 0.5 to 10% by weight, particularly preferably from 1.0 to 5.0% by weight, based in each case on the total weight of the developer, the alkaline agent preferably being an alkanolamine, a hydroxide or a carbonate, particularly preferably ethanolamine, di- or triethanolamine, isopropanolamine, diisopropanolamine or an alkali metal or alkaline earth metal hydroxide.

11. The developer as claimed in claim 1, wherein its pH is from 8.0 to 13.0, preferably from 8.5 to 11.5.

12. The developer as claimed in claim 9, wherein the amount of the water-miscible organic solvent is from 0.5 to 15.0% by weight, preferably from 1.0 to 10.0% by weight, particularly preferably from 2.0 to 6.0% by weight, based in each case on the total weight of the developer, the water-miscible organic solvent preferably being benzyl alcohol, ethylene glycol monophenyl ether, 1-phenylethanol, 2-phenylethanol or propylene glycol monomethyl or -phenyl ether.

13. The developer mixture as claimed in claim 9, wherein the amount of the surface-active compound(s) is from 0.2 to 12.0% by weight, preferably from 0.5 to 8.0% by weight, particularly preferably from 1.0 to 6.0% by weight, based in each case on the total weight of the developer, the surface-active compound preferably being an anionic surfactant, particularly preferably an alkali metal, preferably sodium, octylsulfate, dodecylbenzenesulfonate, alkylphenolethersulfate, naphthalenesulfonate, sulfosuccinate and/or alkyletherphosphate.

14. A method of developing recording material, comprising applying the developer of claim 1 to a recording material having an irradiated, radiation-sensitive negative working layer, for a time sufficient to develop said recording material.

15. A method as claimed in claim 14, wherein the radiation-sensitive component comprises one or more of (a) a diazonium salt polycondensation compound, (b) a combination of ethylenically unsaturated compounds capable of free radical polymerization and photoinitiators or (c) a mixture of (a) and (b).

16. A method according to claim 14, wherein the negative-working layer further comprises a binder.

17. A method according to claim 16, wherein the binder is a reaction product of an intramolecular anhydride of an organic polycarboxylic acid with a synthetic polymer containing hydroxyl groups, which contains no further functional groups capable of reacting with acid anhydrides.

* * * * *